(12) United States Patent
Konno et al.

(10) Patent No.: US 6,986,119 B2
(45) Date of Patent: Jan. 10, 2006

(54) METHOD OF FORMING TREE STRUCTURE TYPE CIRCUIT, AND COMPUTER PRODUCT

(75) Inventors: Tadashi Konno, Kawasaki (JP); Masahiro Sano, Kawasaki (JP); Makoto Saito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 58 days.

(21) Appl. No.: 10/460,161

(22) Filed: Jun. 13, 2003

(65) Prior Publication Data
US 2003/0233627 A1   Dec. 18, 2003

(30) Foreign Application Priority Data
Jun. 18, 2002   (JP) .............................. 2002-176828

(51) Int. Cl.
*G06F 17/50* (2006.01)

(52) U.S. Cl. .............. 716/12; 716/2; 716/7; 716/9

(58) Field of Classification Search ................ 438/129; 716/2, 6, 7, 9, 12
See application file for complete search history.

(56) References Cited

U.S. PATENT DOCUMENTS 6,440,780 B1 * 8/2002 Kimura et al. .............. 438/129

* cited by examiner

*Primary Examiner*—Thuan Do
(74) *Attorney, Agent, or Firm*—Arent Fox PLLC

(57) ABSTRACT

A method of forming a tree structure type circuit includes the steps of dividing a division target region of LSI into a plurality of regions, placing constituent elements as distribution targets in the regions, forming a tree, conducting schematic routing, and conducting timing improvement while considering a clock skew. These processings are repeated by a preset number of times. If the repetition number reaches a specified number, the constituent elements and an added buffer or the like are subjected to detailed placement, and automatic routing is conducted.

12 Claims, 10 Drawing Sheets

INITIAL STATE

AFTER 1ST DIVISION

AFTER 2ND DIVISION

AFTER nTH DIVISION

AFTER (n + 1)TH DIVISION

AFTER nTH DIVISION

AFTER (n + 1)TH DIVISION

METHOD OF FORMING TREE STRUCTURE TYPE CIRCUIT, AND COMPUTER PRODUCT

CROSS-REFERENCE TO RELATED APPLICATIONS

This application is based upon and claims the benefit of priority from the prior Japanese Patent Application No.2002-176828, filed on Jun. 18, 2002, the entire contents of which are incorporated herein by reference.

BACKGROUND OF THE INVENTION

1) Field of the Invention

The present invention relates to a technology for forming a tree structure type circuit that has a tree distribution structure. More particularly, this invention relates to a method of forming a tree structure type circuit such as a clock circuit designed by a method of forming a clock tree, and a computer product.

2) Description of the Related Art

Generally, in designing a layout of large-scale integration (LSI), a clock circuit is often constituted by a tree structure type circuit using the method of forming a clock tree so as to prevent a clock skew. Conventionally, such a tree structure type circuit is automatically formed by a layout tool or the like.

As a method of forming a tree structure type clock circuit, for example, the following two methods have been known. A first method is realized by forming a tree circuit before layout. A tree structure shown in FIG. 1 is formed in accordance with a flow chart shown in FIG. 2 (step S101). Timing driven placement of buffers and circuit elements that does not consider a clock skew is conducted to the tree structure distribution circuit as shown in FIG. 3 (step S102), and routing is conducted to the buffers, circuit elements, and the like thus placed (step S103).

A second method is realized by forming a tree circuit after initial layout. That is, timing driven placement is conducted to a circuit without considering a tree structure as shown in FIG. 4 in accordance with a flow chart shown in FIG. 5 (step S131). It is assumed that this initial placement has either timing with which there is no clock skew or timing with which a fixed margin is provided. As shown in FIG. 6, a tree structure is formed, followed by placement and routing (step S132). At this time, the tree structure is optimized to the layout of a distribution target circuit, so that consumption of routing resources is minimized. Thereafter, based on the tree structure, timing driven placement is improved in view of the actual skew of a clock (step S133), and routing is performed (step S134).

According to the first conventional method, however, in the tree structure as shown in FIG. 1, no consideration is given to coordinates "a", "b", "c", "x", "y", and "z" of elements 11, 12, 13, 14, 15, and 16 that are located at the terminal ends of the distribution circuit, respectively. The tree structure is not, therefore, an optimum tree structure. As a result, on the actual layout, like the elements 13 and 16 at "c" and "z" as shown in FIG. 3, some of the elements may be connected to a clock supply circuit 19 through remote buffers 17 and 18, respectively, and therefore the wiring lengths of the elements may be disadvantageously larger than those of the other elements. Thus, this first method has disadvantages in that a phase difference is large, routing resources are greatly consumed, and high integration layout cannot be realized.

According to the second conventional method, placement is improved after forming a tree. At the initial placement, the scales of circuits to be inserted and the positions of placement and routing resources necessary for these circuits are not clearly given. Therefore, the second method has a disadvantage in that the layout of the circuits and the resources cannot sometimes be performed after the formation of the tree structure.

SUMMARY OF THE INVENTION

The present invention has been achieved in order to solve the above problems. It is an object of this invention to provide a method of forming a tree structure type circuit capable of forming a tree optimized to layout, and accurately estimating the increase in number of circuit elements caused by the insertion of a distribution circuit and the consumption of routing resources by the distribution circuit.

According to one aspect of the present invention, a tree distribution circuit is formed while automatic placement (by a Min-Cut algorithm or the like) for determining coordinates of elements is performed in a top-down manner.

That is, as shown in a flow chart of FIG. 7, a division target region of an LSI is divided into a plurality of regions, and the constituent elements of a distribution target LSI are distributed to the newly divided regions, respectively (step S11). A tree is formed (step S12), and schematic routing is performed (step S13). If necessary, processing for timing improvement is performed in consideration of a clock skew (step S14). These processings are repeated by the preset number of times by which the LSI region is repeatedly divided (step S15). If the repetition number reaches a specified number, the constituent elements as well as added buffers and the like are subjected to detailed placement (step S16). These are processings for timing driven automatic placement. Finally, automatic routing is performed (step S17).

According to the above aspect, the tree type distribution circuit is formed during these processings for automatic placement in which the placement coordinates of the LSI constituent elements are determined in the top-down manner.

These and other objects, features and advantages of the present invention are specifically set forth in or will become apparent from the following detailed descriptions of the invention when read in conjunction with the accompanying drawings.

DETAILED DESCRIPTION

Figure 1:
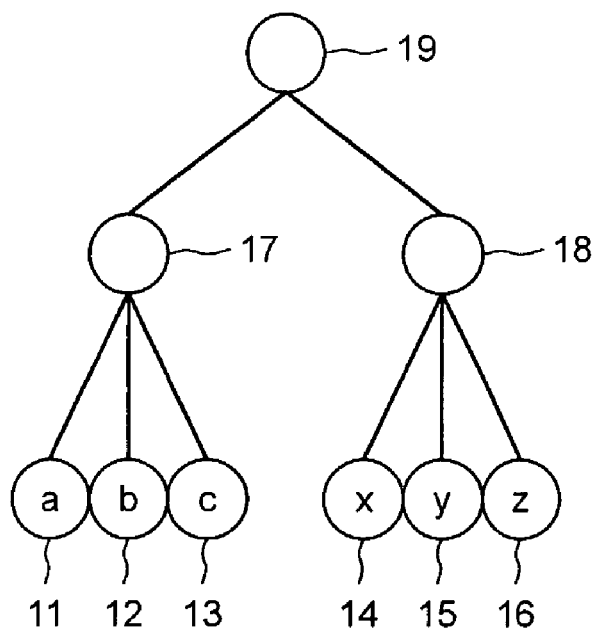
FIG. 1 schematically shows a tree structure formed by the first conventional method of forming a clock circuit.
Figure 2:
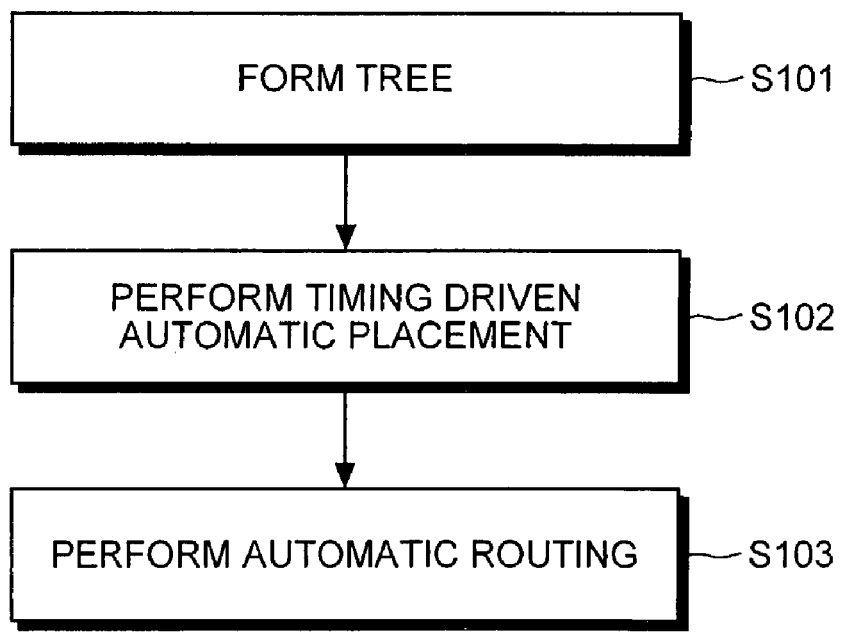
FIG. 2 is a flow chart of the first conventional method, FIG. 3 schematically shows a layout formed by the first conventional method, FIG. 4 schematically shows a layout formed by the second conventional method of forming a clock circuit.
Figure 3:
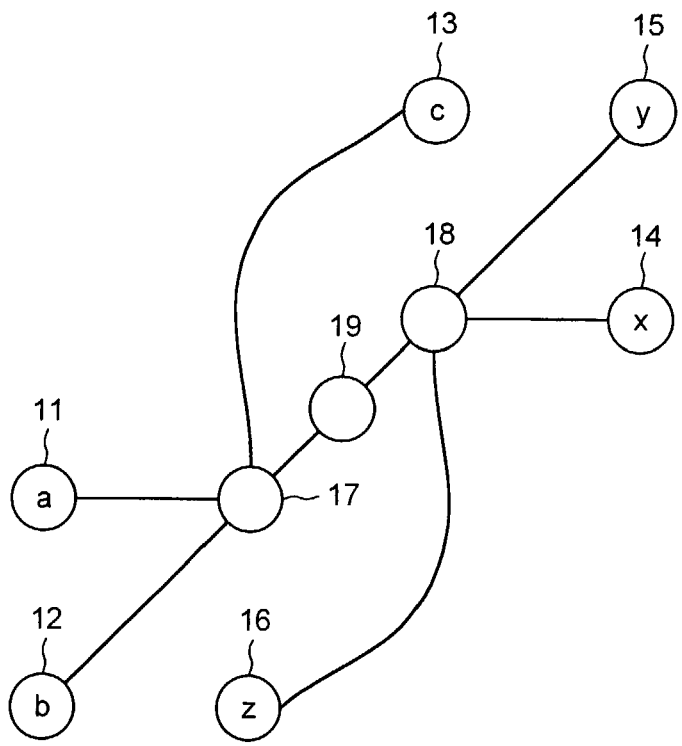
Figure 4:
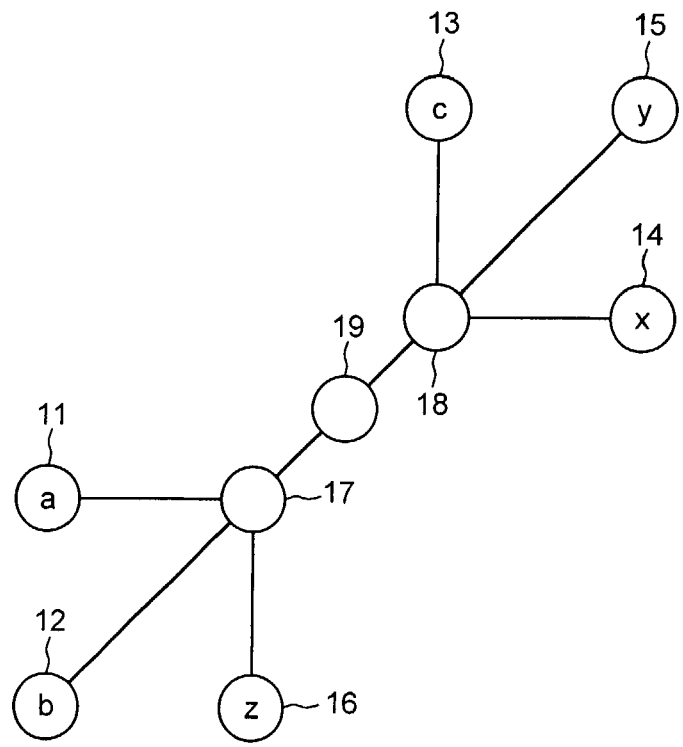
Figure 5:
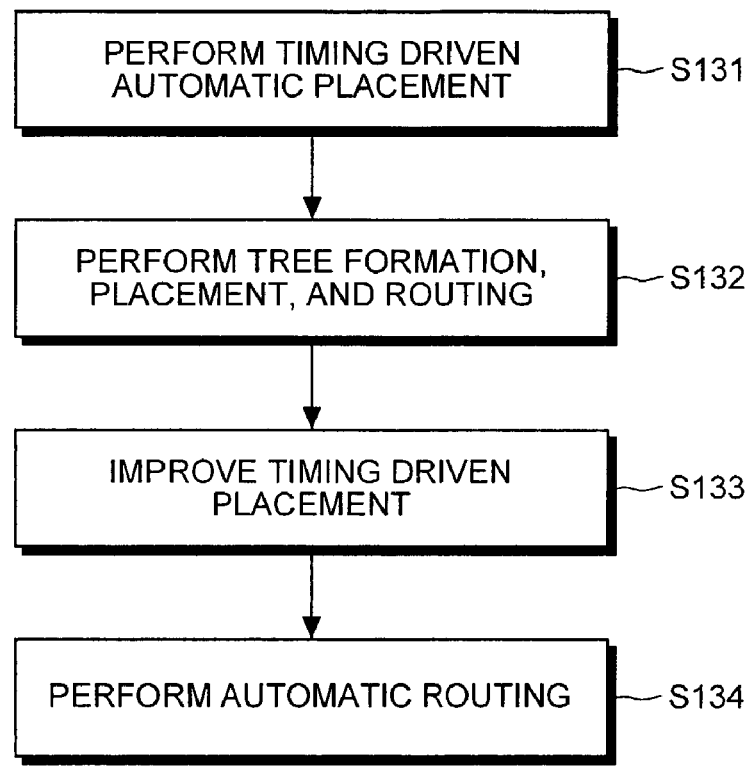
FIG. 5 is a flow chart of the second conventional method, FIG. 6 schematically shows a tree structure formed by the second conventional method.
Figure 6:
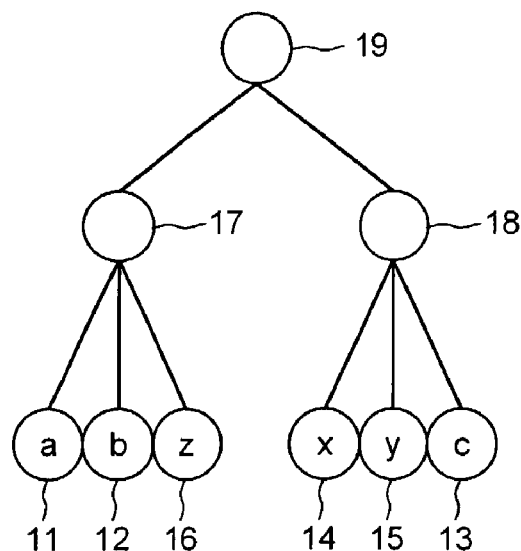
Figure 7:
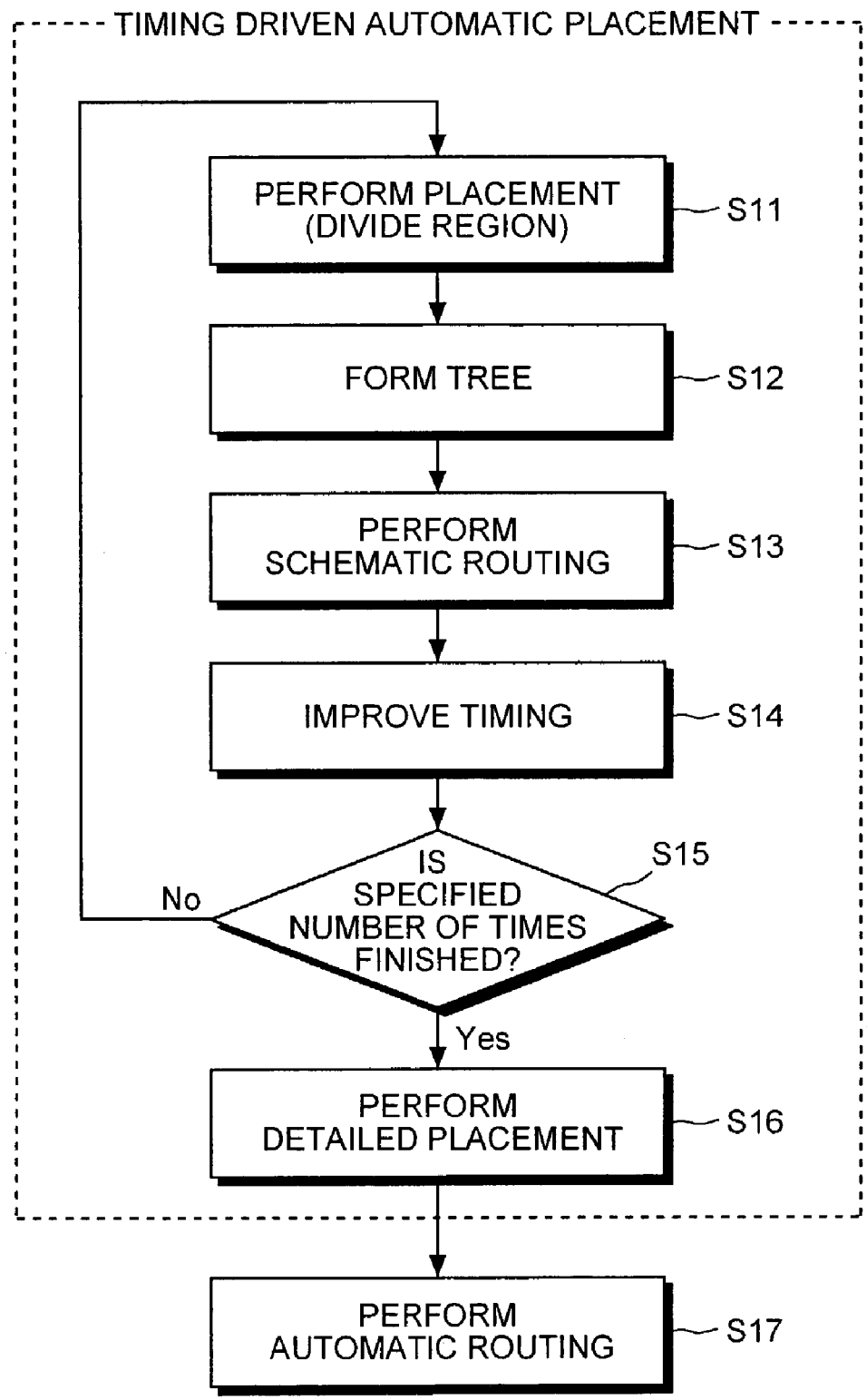
FIG. 7 is a flow chart of the method of forming a tree structure type circuit according to the present invention.
Figure 8:
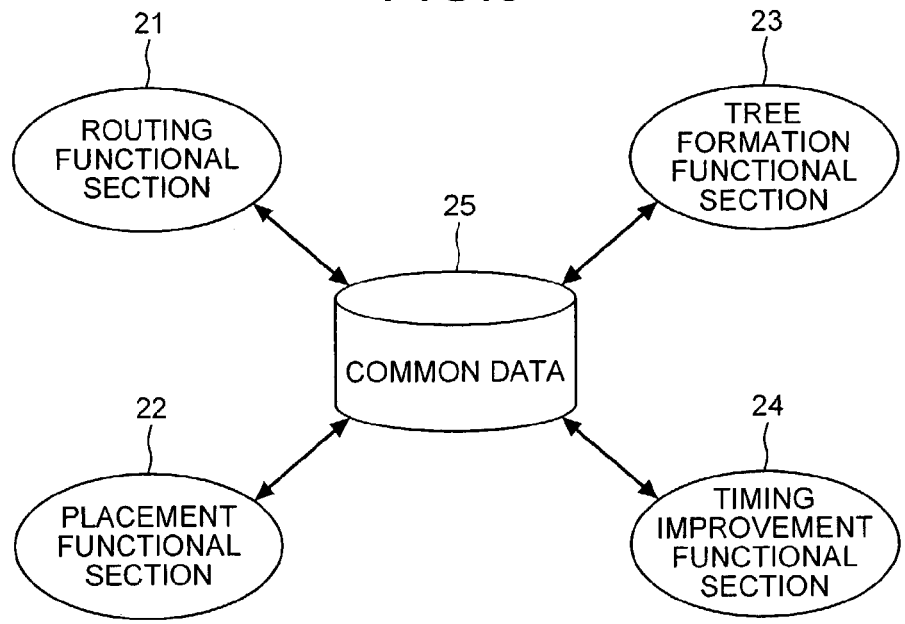
FIG. 8 shows a schematic diagram of the functional configuration of an automatic layout tool used to carry out the method.

An embodiment of the present invention will be explained in detail below with reference to the drawings. FIG. 8 shows a schematic diagram of the functional configuration of an automatic layout tool used to carry out the method of the present invention. As shown in FIG. 8, the automatic layout tool comprises a routing functional section 21, a placement functional section 22, a tree formation functional section 23, and a timing improvement functional section 24. These functional sections access common data 25, thereby the automatic layout tool can obtain the latest layout data and the result of estimates of the increase in number of circuits due to formation of a tree and the like.

Figure 9:
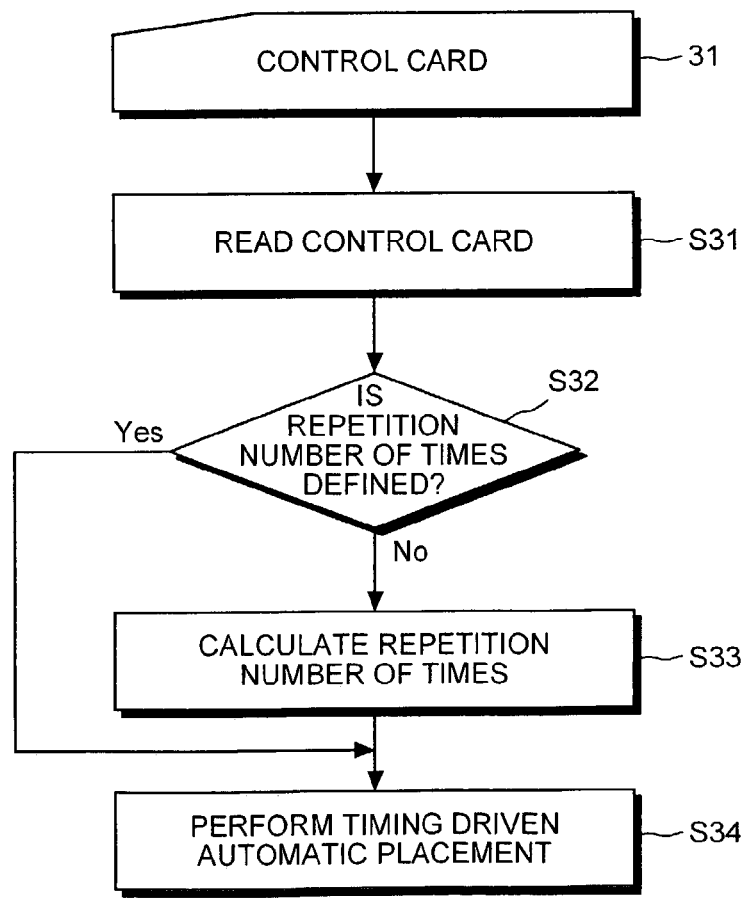
FIG. 9 is a flow chart of a part of a sequence for forming a clock circuit by using the method.
Figure 10:
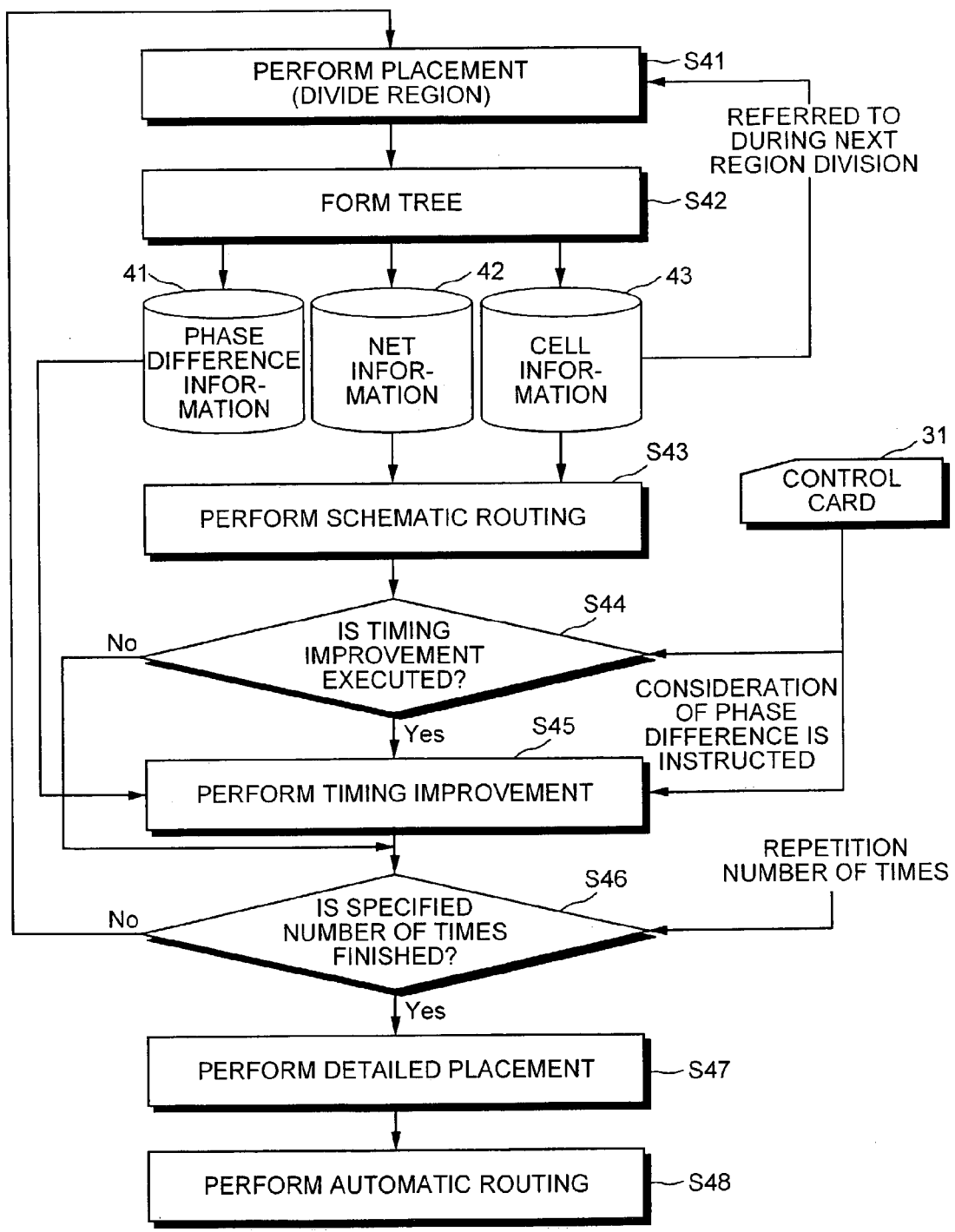
FIG. 10 is a flow chart of a part of the sequence for forming the clock circuit by using the method.

FIG. 9 and FIG. 10 are flow charts of sequences of forming a clock circuit when LSI constituent elements are placed in a top-down manner by the method of forming a tree structure type circuit according to the present invention.

As shown in FIG. 9, if the processing for forming a clock circuit starts, control data such as design conditions is read from a control card 31 (step S31). It is determined whether the number of times of repeatedly dividing an LSI region (to be referred to as "repetition number of times") is defined in the control data (step S32). If it is determined that the repetition number of times is not defined, then the repetition number of times is automatically calculated based on a circuit scale (step S33). Alternatively, an operator may instruct the repetition number of times using an input unit such as a not shown keyboard.

If the repetition number of times is determined in such a manner, then the processing proceeds to timing driven placement processing of LSI constituent elements (step S34). If it is determined at step S32 that the repetition number of times is defined in the control data, the processing directly proceeds to the timing driven placement processing at step S34.

Figure 12:
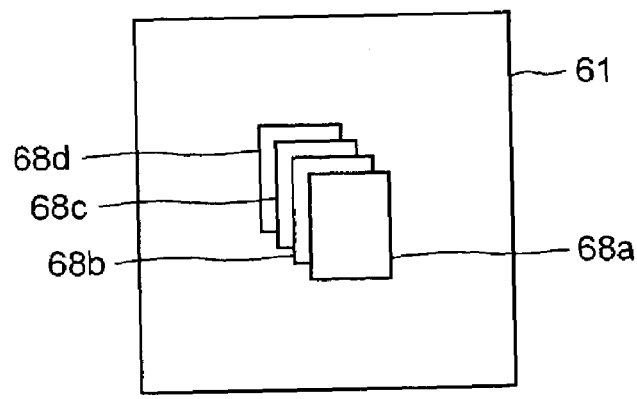
Figure 12:
Figure 12:
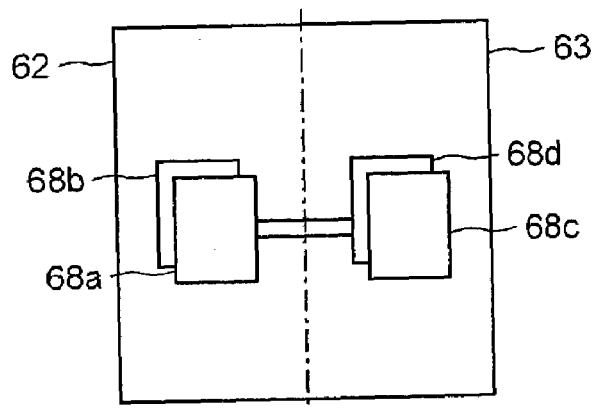
Figure 12:
Figure 12:
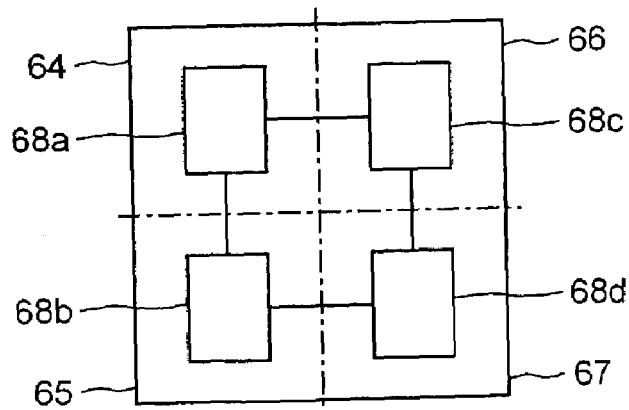

An example of repeatedly dividing the LSI region into two regions will be schematically shown in FIG. 12. As shown in FIG. 12, an entire region 61 of the LSI is divided into two regions of a first region 62 and a second region 63 by a first division. The first region 62 is divided into a third region 64 and a fourth region 65, and the second region 63 is divided into a fifth region 66 and a sixth region 67 by a second division. If the repetition number of times is three or more, the division processing is repeated in the same manner as explained above at the third and the following divisions. The number of divided regions is not limited to two but the division target region can be divided into an arbitrary number of regions such as three or four.

If the processing proceeds to the timing driven placement processing at step S34 of FIG. 9, as shown in FIG. 10, the processing for first division is performed on the LSI entire region 61, and the LSI constituent elements are distributed to the respective divided regions (step S41, see FIG. 12). At this time, the coordinates of constituent elements as distribution targets are not determined in detail. Therefore, as shown in FIG. 12, it is assumed that constituent elements 68a, 68b, 68c, and 68d included in the divided regions are located at each center of the divided regions, respectively.

Referring again to FIG. 10, after the region division processing at step S41, the processing for forming a tree is performed (step S42). At this time, the coordinate of a buffer placed on the tree thus formed may be assumed as a central coordinate of the divided region or as a certain coordinate of the divided region. The method of forming a tree may be a top-down method or a bottom-up method. Phase difference information 41, net information 42, and cell information 43 are acquired based on the tree thus formed, and schematic routing is performed based on the net information 42 and the cell information 43 (step S43). It is determined whether to execute the processing for timing improvement based on the control data provided from the control card 31 (step S44).

The timing improvement processing is performed if it is so determined at the step S44 (step S45). At this time, if it is instructed to consider a clock skew based on the control data provided from the control card 31, the timing improvement processing is performed based on the phase difference information 41. Thereafter, it is determined whether the processings at the steps S41 to S45 are performed by the repetition number of times specified by the automatic calculation or by the operator's input at steps S31 to S33 in the flow chart of FIG. 9 (step S46).

If it is determined at step S44 that the timing improvement processing is not performed, the processing skips the step S45 and proceeds to a determination processing at step S46. In this case, an optimum tree to the layout is formed, and only the increase of elements and wirings by the tree formation is reflected in the routing functional section 21 and the placement functional section 22 (see FIG. 8).

If it is determined at step S46 that the number of times of performing the steps S41 to S45 does not reach the specified repetition number of times, the steps S41 to S46 are repeated. That is, a second region division processing is performed to thereby form a tree for each divided region, and schematic routing is performed. If it is determined that the timing improvement processing is to be performed, the processing is performed. Thereafter, it is determined again whether the number of times of performing steps S41 to S45 reaches the specified repetition number of times. In the third cycle and the following, the processing is performed in the same manner. That is, until it is determined at step S46 that the number of times of performance reaches the specified repetition number of times, the steps S41 to S46 are repeated. If the processing for region division is to be performed in the second and the following cycles, the cell information 43 acquired during the previous region division is referred to.

If the number reaches the specified repetition number of times, the LSI constituent elements, the added buffer, and the like are placed in detail and the coordinates thereof are determined (step S47). Based on the detailed placement, an automatic routing processing is performed (step S48), thus completing the timing driven automatic placement and automatic routing of the LSI constituent elements.

The coordinate of the buffer placed on the tree formed at step S42 may not be determined. In this case, the buffer is included in one of the regions formed by further dividing the present region of the buffer by the next region division and is moved from the initial coordinate position. Finally, the placement coordinate of the buffer is determined by the detailed placement at step S47.

In all cycles from the first region division until the number of times reaches the specified repetition number, it is unnecessary to consider a clock skew in the processing for timing improvement at step S45. That is, it is possible to arbitrarily determine whether to consider the clock skew in the processing for timing improvement. For example, in the repetition cycles at steps S41 to S46, the timing improvement can be performed without considering the clock skew until a certain cycle (for example, a third cycle) comes to an end, and the timing improvement can be performed while considering the clock skew in the next cycle (for example, a fourth cycle).

Figure 13:
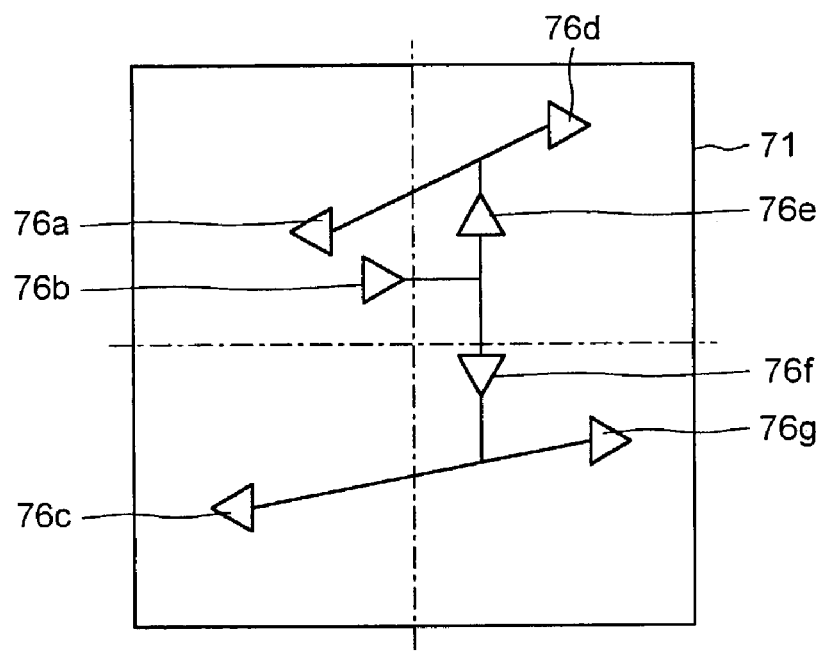
Figure 13:
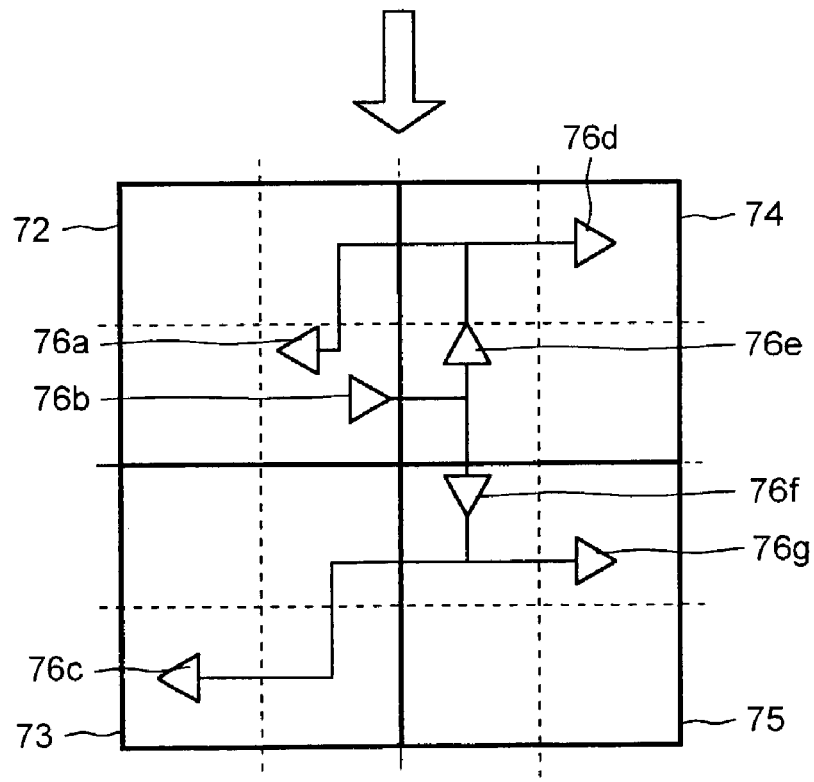

In the second and the following cycles, it is necessary to succeed the content of estimates made in the previous cycle during the tree formation processing at step S42. Therefore, as shown in FIG. 13, a tree is formed while paying attention to the layout state (tree shape) in the previous cycle. FIG. 13 schematically shows how to succeed routes formed in the previous cycle, during the formation of the tree. In FIG. 13, reference symbol 71 denotes a region divided after the $n^{th}$ division, and reference symbols 72, 73, 74, and 75 denote divided regions after the $(n+1)^{th}$ division, respectively. Reference symbols 76a, 76b, 76c, 76d, 76e, 76f, and 76g denote added buffers.

Figure 14:
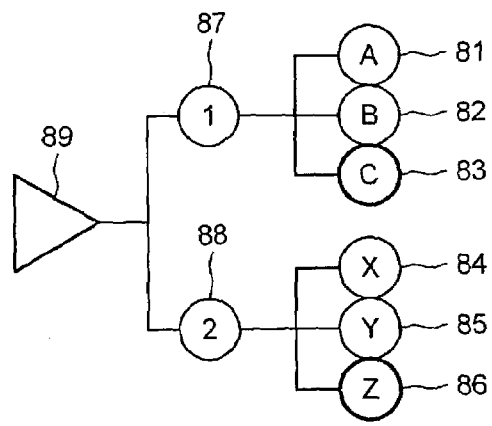
Figure 14:
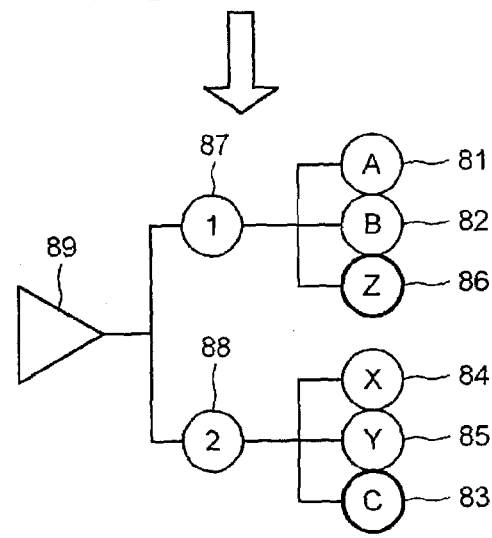

If the input of the distribution target elements (81 to 86) satisfy both conditions such that these target elements are equal in polarity, that is, they are equal in logic inversion and non-inversion, and that the target elements do not pass through the other input cell halfway from the viewpoint of a source 89 shown in FIG. 14, these constituent elements are considered to be equivalent. Accordingly, as shown in FIG. 14, information for connection from the source 89 to the terminal constituent elements 81, 82, 83, 84, 85, and 86 through buffers 87 and 88 is of no significance. Therefore, as shown in the example, the element 83 at the coordinate "c" connected to the buffer 87 at the coordinate "1" of the tree in the $n^{th}$ cycle and the element 86 at the coordinate "z" connected to the buffer 88 at the coordinate "2" may be exchanged in the $(n+1)^{th}$ cycle. This means that a region division manner is not influenced by the connection relationship of the constituent elements if more detailed region division is conducted in the next cycle.

Figure 11:
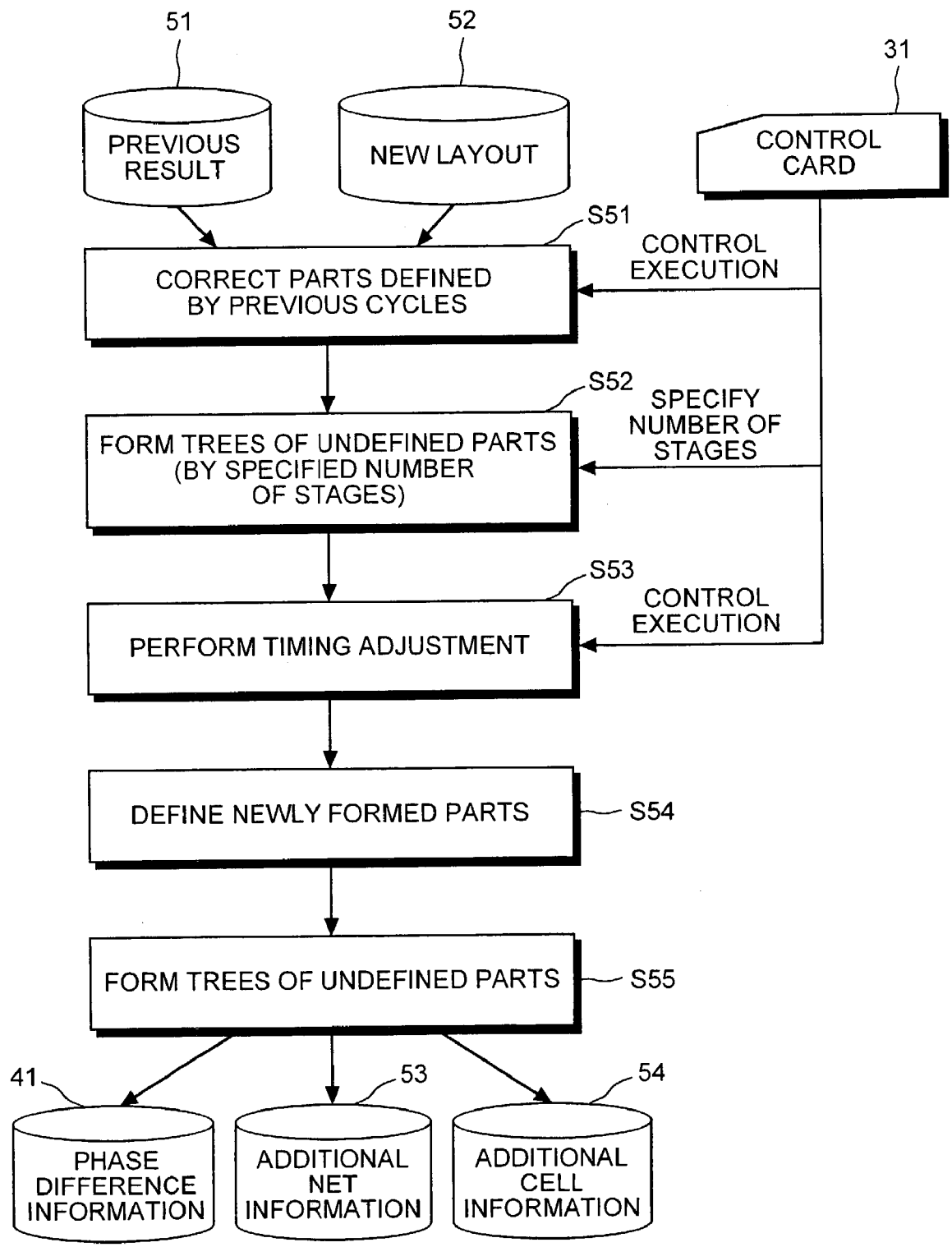
FIG. 11 is a flow chart of the detail of a tree formation processing in a second and the following cycles of the method, FIG. 12 schematically shows how to divide the circuit with layout images if the method is executed, FIG. 13 schematically shows how to succeed routes formed in a previous cycle, during the tree formation processing of the method, FIG. 14 schematically shows how to exchange constituent elements connected equivalently to one another in a tree formation process of the method.

FIG. 11 is a flow chart of the detail of the tree formation processing in the second and the following cycles of the method of forming a tree structure type circuit according to the present invention. In the second and the following cycles, based on a result 51 obtained in the previous cycle and a new layout 52, the defined part of each tree formed by the time the previous cycle comes to an end is corrected (step S51). This correction processing is executed based on the control data provided from the control card 31. Undefined parts of trees are formed by a specified number of stages (step S52). The number of stages is specified based on the control data provided from the control card 31.

The timing adjustment is performed on the distribution circuit (step S53). This timing adjustment processing can be executed in an arbitrary cycle, and it is determined whether to execute the timing adjustment processing based on the control data provided from the control card 31. The newly formed trees are defined (step S54). Undefined trees are formed (step S55) to obtain phase difference information 41, additional net information 53, and additional cell information 54, and the processing proceeds to a schematic routing processing.

In the circuit formation method, an element top-down placement method in which the distribution of a tree structure is focused will be explained below. The circuits increased in the previous cycle are allocated to each of the newly divided regions by a region division processing in this cycle. At this moment, the allocation is performed in proportion to the number of distribution target constituent elements included in each region.

Figure 15:
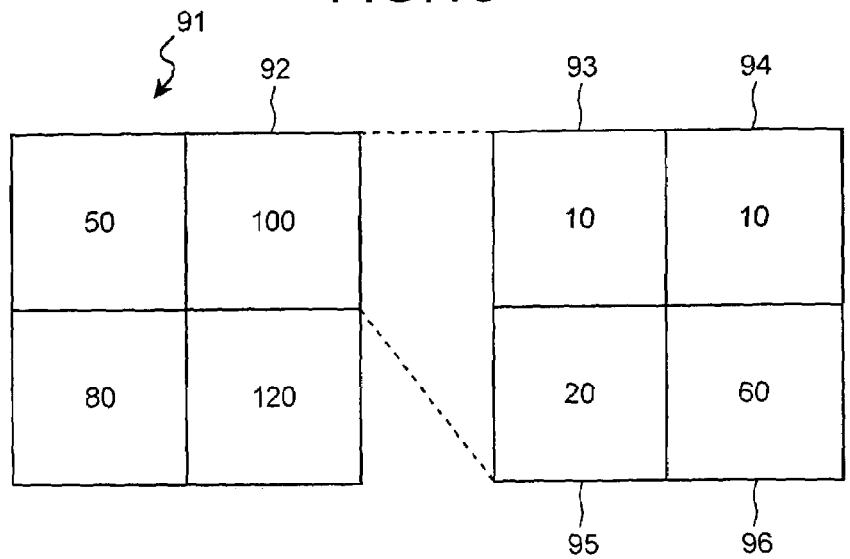
FIG. 15 shows a method of succeeding an estimate of an increase in number of circuits in a region division processing of the method.

For example, as shown in FIG. 15, a case when an upper right region 92 of a region 91 shown on the left side of FIG. 15 is further divided into four regions 93, 94, 95, and 96 shown on the right side of FIG. 15, will be explained. Assume that it is estimated in the previous cycle that 100 buffers are generated in the upper right region 92 of the region 91. Further assume that among the distribution target constituent elements included in the upper right region 92 of the region 91, 10% of the elements are allocated to the upper left region 93 and the upper right region 94 on the right side of FIG. 15, 20% of the elements are allocated to each of the lower left region 95, and 60% of the elements are allocated to the lower right region 96.

In this case, among 100 buffers generated in the upper right region 92 of the left region 91 shown on the left side of FIG. 15, 10 buffers are allocated to each of the upper left region 93 and the upper right region 94, 20 buffers are allocated to the lower left region 95, and 60 buffers are allocated to the lower right region 96. If the elements that should be initially driven by using the 100 buffers are allocated to the four regions 93, 94, 95 and 96 on the right side of FIG. 15 at the rate explained above by a new region division processing, the number of buffers necessary to drive the allocated elements in each of the four regions 93, 94, 95, and 96 is almost proportional to the allocation rate.

The method of forming the tree structure type circuit explained so far can be realized by allowing a computer such as a personal computer or a workstation to execute a program prepared in advance. This program is recorded on a computer readable recording medium such as a hard disk, a flexible disk, a CD-ROM (Compact Disk-Read Only Memory), an MO (Magneto Optical Disk), or DVD (Digital Versatile Disk), and is read from the recording medium by a computer to be executed. Alternatively, this program can be distributed through the recording medium over a network such as the Internet.

According to the embodiment, the tree-like distribution circuit is formed while conducting the automatic placement processing for determining the placement coordinates of the LSI constituent elements in the top-down manner. Therefore, it is possible to form trees optimized to the layout, and to accurately estimate the increase in number of the circuit elements caused by insertion of the distribution circuit and the consumption of routing resources caused by the distribution circuit. In addition, it is possible to examine a clock skew to make timing adjustment before placement is completed. Therefore, it is possible to prevent a timing error from occurring after completion of the timing driven placement.

The present invention can be applied to not only the formation of the clock circuit but also the formation of any tree structure type circuit other than the clock circuit.

According to the present invention, it is possible to form trees optimized to layout, and to accurately estimate the increase in number the circuit elements caused by insertion of the distribution circuit and the consumption of routing resources caused by the distribution circuit. In addition, according to the present invention, if timing driven placement is performed, it is possible to prevent a timing error from occurring after completion of the placement.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of forming a tree structure type circuit that includes a tree-like distribution structure, the method comprising:
    a first step of dividing a division target layout region where the circuit is placed into a plurality of regions, and distributing constituent elements of the circuit as distribution targets to the regions newly formed through the division;
    a second step of forming a tree in each of the regions;
    a third step of performing schematic routing based on the formed tree; and
    a fourth step of conducting detailed placement to the constituent elements and an element or elements added during formation of the tree,
    wherein among the distribution target constituent elements, constituent elements that are equal in polarity and have the same tree level are considered to be equivalent to each other.

2. The method according to claim 1, further comprising a fifth step of conducting automatic routing to the elements subjected to the detailed placement.

3. The method according to claim 1, wherein at the first step, placement coordinates of the distribution target constituent elements are assumed to be located at each center of the regions in which the constituent elements are included, respectively.

4. The method according to claim 1, wherein placement coordinates of the element added at the second step is assumed to be located at a center of a region in which the element is included.

5. A The method of forming a tree structure type circuit that includes a tree-like distribution structure, the method comprising:
    a first step of dividing a division target layout region where the circuit is placed into a plurality of regions, and distributing constituent elements of the circuit as distribution targets to the regions newly formed through the division;
    a second step of forming a tree in each of the regions;
    a third step of performing schematic routing based on the formed tree; and
    a fourth step of conducting detailed placement to the constituent elements and an element or elements added during formation of the tree,
    wherein the fourth step is executed after processing from the first step to the third step is repeated by a preset number of times, and
    wherein circuits increased in a previous cycle are allocated to regions, newly formed through division, in proportion to a number of the distribution target constituent elements that are allocated to the regions.

6. The method according to claim 5, wherein a defined portion of each of the trees formed in a previous cycle is corrected at the beginning of the current cycle.

7. A method of forming a tree structure type circuit that includes a tree-like distribution structure, the method comprising:
    a first step of dividing a division target layout region where the circuit is placed into a plurality of regions, and distributing constituent elements of the circuit as distribution targets into the regions newly formed through the division;
    a second step of forming a tree in each of the regions;
    a third step of conducting schematic routing based on the formed tree;
    a fourth step of conducting timing improvement based on the schematic routing; and
    a fifth step of conducting detailed placement to the constituent elements and an element or elements added during formation of the tree,
    wherein among the distribution target constituent elements, constituent elements included in an identical region and distributed from an identical source are considered to be equivalent to each other.

8. The method according to claim 7, further comprising a sixth step of conducting automatic routing to the elements subjected to the detailed placement.

9. The method according to claim 7, wherein at the first step, placement coordinates of the distribution target constituent elements are assumed to be located at each center of the regions in which the constituent elements are included, respectively.

10. The method according to claim 7, wherein placement coordinates of the element added at the second step is assumed to be located at a center of a region in which the element is included.

11. A The method of forming a tree structure type circuit that includes a tree-like distribution structure, the method comprising:
    a first step of dividing a division target layout region where the circuit is placed into a plurality of regions, and distributing constituent elements of the circuit as distribution targets into the regions newly formed through the division;
    a second step of forming a tree in each of the regions;
    a third step of conducting schematic routing based on the formed tree;
    a fourth step of conducting timing improvement based on the schematic routing; and
    a fifth step of conducting detailed placement to the constituent elements and an element or elements added during formation of the tree,
    wherein the fifth step is executed after processing from the first step to the fourth step is executed by a preset number of times, and
    wherein circuits increased in a previous cycle are allocated to regions newly formed through division in proportion to a number of the distribution target constituent elements that are allocated to the regions.

12. The method according to claim 11, wherein a defined portion of each of the trees formed by the time a previous cycle comes to an end is corrected at the beginning of the second step.

* * * * *